(12) United States Patent
Nishihara et al.

(10) Patent No.: US 6,388,361 B1
(45) Date of Patent: May 14, 2002

(54) SURFACE ACOUSTIC WAVE DEVICE AND PROCESS FOR MANUFACTURING THE SAME

(75) Inventors: Tokihiro Nishihara; Osamu Ikata; Yoshio Satoh, all of Kawasaki (JP)

(73) Assignees: Fujitsu Limited, Kawasaki; Fujitsu Media Devices Limited, Suzaka, both of (JP)

( * ) Notice: Subject to any disclaimer, the term of this patent is extended or adjusted under 35 U.S.C. 154(b) by 0 days.

(21) Appl. No.: 09/639,099

(22) Filed: Aug. 16, 2000

(30) Foreign Application Priority Data

Oct. 18, 1999 (JP) .............................. 11-295470

(51) Int. Cl.$^7$ ................................. H03H 9/25
(52) U.S. Cl. ................ 310/313 R; 310/313 B
(58) Field of Search .................. 310/313 R, 364, 310/363, 365, 313 B, 1

(56) References Cited

U.S. PATENT DOCUMENTS

| | | | |
|---|---|---|---|
| 4,775,814 A | * 10/1988 | Yuhara et al. | 310/313 B |
| 4,942,327 A | * 7/1990 | Watanabe et al. | 310/313 A |
| 5,446,329 A | * 8/1995 | Nakahata et al. | 310/313 A |
| 5,909,156 A | * 6/1999 | Nishihara et al. | 29/25.35 |

FOREIGN PATENT DOCUMENTS

| | | | |
|---|---|---|---|
| JP | 64-80113 | 3/1989 | |
| JP | 02-274008 | 11/1990 | |
| JP | 05-90268 | 4/1993 | |
| JP | 05-183378 | 7/1993 | |
| JP | 05-226337 | 9/1993 | |
| JP | 07-135443 | 5/1995 | |
| JP | 05183378 | * 7/1996 | ............ H03H/9/25 |
| JP | 08-330892 | 12/1996 | |
| JP | 08-340233 | 12/1996 | |
| JP | 10-22764 | 1/1998 | |

* cited by examiner

Primary Examiner—Nestor Ramirez
Assistant Examiner—Karen Addison
(74) Attorney, Agent, or Firm—Armstrong, Westerman & Hattori, LLP

(57) ABSTRACT

A surface acoustic wave device includes a substrate at least a surface of which has a piezoelectric function, and an electrode formed on the substrate, wherein the electrode is composed of a first film of Al containing Cu at or over a solid solubility limit of Cu to Al and one or more unit(s) of a second film of Al containing Mg at or over a Solid solubility limit of Mg to Al and a third film of Al containing Cu at or over the solid solubility limit of Cu to Al formed on the first film in this order, and the first film and the third film contain Mg diffused from the second film.

5 Claims, 4 Drawing Sheets

SURFACE ACOUSTIC WAVE DEVICE AND PROCESS FOR MANUFACTURING THE SAME

CROSS-REFERENCE TO RELATED APPLICATION

This application is related to Japanese Patent Application No. HEI 11(1999)-295470 filed on Oct. 18, 1999, whose priority is claimed under 35 USC § 919, the disclosure of which is incorporated by reference in its entirety.

BACKGROUND OF THE INVENTION

1. Field of the Invention

The present invention relates to a surface acoustic wave (SAW) device and a process for manufacturing the same. More particularly, the present invention relates to a SAW device having an improved power durability and its manufacture process. The surface acoustic wave device of the present invention can be suitably used as a SAW device (a resonator, an interstage filter, a duplexer or the like) in mobile communication terminals such as automobile phones and portable phones.

2. Description of Related Art

Recently, development of smaller and less heavy mobile communication terminals such as automobile phones and portable phones has been rapidly taking place. With this development, there is an increasing need for smaller and more efficient parts for the mobile communication terminals, giving rise to the need also for surface acoustic wave (SAW) devices that contribute to miniaturization of high frequency (RF) sections.

Among the duplexers, the antenna duplexer is typically located at the front end section of the RF section and requires large power durability. Here, since conventional SAW devices do not have a sufficient power durability, dielectric filters have been used. Having a large size, however, the dielectric filters have been an obstacle to miniaturization.

Generally, the SAW device is comprised of interdigital transducers on a piezoelectric single-crystal substrate of $LiNbO_3$, $LiTaO_3$, rock crystal or the like. Al (aluminum) and Al alloys which have excellent characteristics such as low resistance, light weight and good micro-workability are widely used for the interdigital transducers. When a high-power high-frequency signal is applied to the SAW device, electromigration caused by high-frequency current and mechanical migration caused by displacement of a SAW are liable to occur in Al of the interdigital transducers. The interdigital transducers are thus deteriorated, and as a result, the characteristics of the SAW device are also deteriorated, as those skilled in the art know.

For improving the power durability of the SAW device, electrodes formed of the following materials have been proposed:

(1) Electrodes of an Al alloy consisting of two elements, that is, Al and another element:
 Al-0.1 to 0.3 wt % Pd (Japanese Unexamined Patent Publication No. HEI 2(1990)-274008)
 Al-0.01 to 5 wt % Sc (Japanese Unexamined Patent Publication No. HEI 5(1993)-183378)
(2) Electrodes of an Al alloy consisting of three or more elements, that is, Al and other two or more elements:
 Al—Cu—Mg (Japanese Unexamined Patent Publication No. SHO 64(1989)-80113)
 Al-additive A-additive B (additive A is a metal that forms solid solution with Al (Sc, Ga, Hf, Zn, Mg), additive B is a metal that forms an intermetallic compound with Al (Ge, Cu, Si)) (Japanese Unexamined Patent Publication No. HEI 10(1998)-22764)

Since desired characteristics cannot be realized with the above-mentioned single-layer electrodes, the following electrodes consisting of laminated films have been proposed:
 a laminate of an Al—Cu film and a Cu film (Japanese Unexamined Patent Publication No. HEI 7(1995)-122961)

This publication describes that $CuAl_2$ formed at a grain boundary of the Al—Cu film and at an interface between the Al—Cu film and the Cu film can prevent migrations.
 a laminate of an Al—Cu film (lower layer) and an Al—Sc—Cu film (upper layer) (Japanese Unexamined Patent Publication No. HEI 8(1996)-330892)

This publication describes that the use of the Al—Sc—Cu film for the upper layer which has a large stress and the Al—Cu film for the lower layer which has a higher current density can achieve both improvement in the power durability and reduction in signal loss.
 laminates of an Al or Al alloy film (upper layer) and films of various kinds (lower layer) (Japanese Unexamined Patent Publication Nos. HEI 5(1993)-90268, HEI 5(1993)-226337, HEI 7(1995)-135443, HEI 8(1996)-340233)

These publications describe that the orientation properties of the Al or Al alloy film is improved by selecting a material for the lower layer and thereby a migration resistance is enhanced.
 a laminate of an Al or Al alloy film and a film of a metal having a larger coefficient of diffusion into Al than a coefficient of self diffusion of Al (Japanese Unexamined Patent Publication No. HEI 9(1997)-223944)

This publication describes that the power durability is improved by an alloy layer or solid solution layer formed by mutual diffusion of the components of the two films.

However, none of the above-mentioned constructions can provide sufficient characteristics.

The inventors of the present invention have found that the power durability is improved by laminated Al-3 to 10 wt % Mg film and Al-0 to 5 wt % X film (X is selected from the group consisting of Cu, Ti, Pd, gi and Ge) (see Japanese Unexamined Patent Publication No. HEI 10(1998)-135767). With this construction, a good power durability can be achieved by a solid solution enhancement of the Al—Mg alloy.

However, with an increasing need for further miniaturization of SAW device and also for higher-frequency SAW devices, the electrodes of the SAW devices are becoming smaller and further improvement of the power durability is desired, for example, for application as a quasi-microwave band filter.

SUMMARY OF THE INVENTION

Accordingly, the present invention provides a surface acoustic wave device including a substrate at least a surface of which has a piezoelectric function, and an electrode formed on the substrate, wherein the electrode is composed of a first film of Al containing Cu at or over a solid solubility limit of Cu to Al and one or more unit(s) of a second film of Al containing Mg at or over a solid solubility limit of Mg to Al and a third film of Al containing Cu at or over the solid solubility limit of Cu to Al formed on the first film in this order, and the first film and the third film contain Mg diffused from the second film.

The present invention also provides a process for manufacturing a surface acoustic wave device including a substrate at least a surface of which has a piezoelectric function and an electrode formed on the substrate, the process including the steps of forming a first film of Al containing Cu at or over the solid solubility limit of Cu to Al on the substrate, forming one or more unit(s) of a second film of Al containing Mg at or over the solid solubility limit of Mg to Al and a third film of Al containing Cu at or over the solid solubility limit of Cu to Al on the first film in this order, and thermally treating the first, second and third films at a temperature of 100 to 350° C. so as to diffuse Mg from the second film to the first and third films, thereby forming the electrode.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
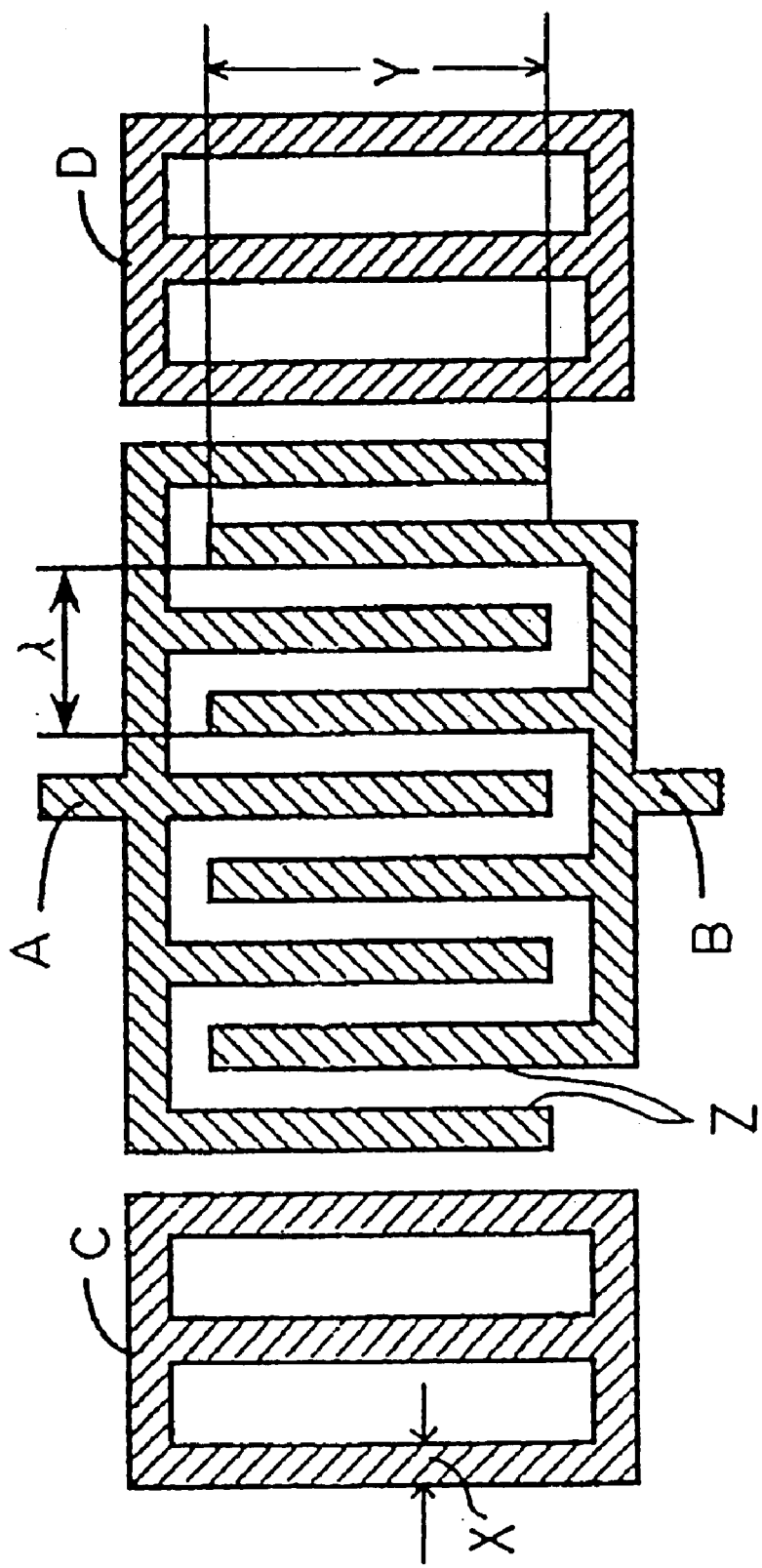
FIG. 1 is a schematic plan view of electrodes of a SAW device in accordance with the present invention.

As a result of a concentrated study of constructions of SAW filters which can effectively utilize the below-described finding of physical phenomena, the inventors of the present invention have found that the power durability can be improved further by adopting the construction of a laminated film of an Al—Cu film and an Al—Mg film and setting suitable ratios for Mg and Cu contained.

The finding is that, when an Al film containing Mg at or over the solid solubility limit of Mg to Al is heated, Mg which cannot be solid-dissolved is separated at the grain boundary of Al and part of separated Mg diffuses toward the surface of the film and the interface with the substrate. The diffused Mg is easily oxidized when reaching the surface of the film and the interface with the substrate. The oxidized Mg causes bonding failure, corrosion and the like in the surface of the film and causes increase in resistance at the interface, which results in deterioration in electrical characteristics of the SAW device.

As stated above, the diffused Mg is unnecessary substance because it reduces the reliability of the electrodes. However, if the amount of Mg added is too small, then the desired power durability cannot be obtained. This has been very problematic.

According to the present invention, however, a technique has been found which can utilize the diffused Mg, which has customarily been a troublesome existence, effectively for improvement of the power durability. This is explained with an example of an electrode formed of three layers which are the first film of Al containing Cu at or over the solid solubility limit of Cu to Al, the second film of Al containing Mg at or over the solid solubility limit of Mg to Al and the third film of Al containing Cu at or over the solid solubility limit of Cu to Al. These three layers are a minimum number of laminated layers according to the invention.

When this electrode composed of the three layers is subjected to thermal treatment at an appropriate temperature, Mg which cannot remain solid-dissolved in the second film separates out at the grain boundary and then diffuses into the first and third films disposed as sandwiching the second film. On the other hand, Cu in the first and third films separates out at the grain boundaries of the first and third films, where an alloy of three components, i.e., Al, Mg and Cu, forms.

These three components are the same as components of duralumin, which is known to have an excellent mechanical strength and a high migration resistance. It is easily understood that the electrode of the present invention also has an excellent mechanical strength and migration resistance.

That is, according to the present invention, effective separation of the Al—Mg—Cu alloy in the Al grain boundaries (separation enforcement) adds a synergistic effect to the effect of solid solution enforcement of the Al—Mg alloy. Thus, it is possible to obtain a SAW device having an electrode whose power durability is remarkably improved.

In addition, since the alloy of three components, Al, Mg and Cu, is separated out at the grain boundaries more effectively in the present invention than in the currently reported electrode of a single layer of an Al—Mg—Cu alloy and the present invention presents the effect of the solid solution enforcement of the Al—Mg alloy, the electrode of the present invention has a more excellent power durability.

It is noted that the solid solubility limit means the solubility limit of solute atoms to solvent atoms in a solid solution. More particularly, it means a limit quantity of Cu or Mg (solute atoms) that can exist in the form of an alloy in a crystal of Al (solvent atoms). For example, the solid solubility limit is about 2.9 wt % for Mg at 200° C. and about 0.2 wt % for Cu at 250° C. However, the solid solubility limit in the present specification is that at room temperature, and therefore, is smaller than that at the above-mentioned temperatures.

The present invention is now described in further detail.

First, the SAW device of the present invention is comprised of a substrate having a piezoelectric function at least on its surface and an electrode formed on the substrate.

Any substrate that can be used for SAW devices may be used in the present invention without particular limitation. For example, may be mentioned piezoelectric single-crystal substrates such as $LiNbO_3$ substrates, $LiTaO_3$ substrates, rock crystal substrates and the like. In addition to these substrates, the present invention includes constructions in which piezoelectric thin films such as ZnO, AlN and the like are formed on high sonic speed transmitting substrates such as sapphire substrates, Si substrates having diamond films formed thereon and the like.

Next, an electrode is formed on the substrate. The electrode has a first film of Al containing Cu at or over the solid solubility limit of Cu to Al and at least one unit of a second film of Al containing Mg at or over the solid solubility limit of Mg to Al and a third film of Al containing Cu at or over the solid solubility limit of Cu to Al in this order. The above-mentioned structure of the electrode means that the electrode may have any number of layers so long as its bottommost and topmost layers are Al films containing Cu at or over the solid solubility limit of Cu to Al. However, the electrode is preferably formed of three to nine layers from the viewpoint of simple and easy manufacture.

The above-described electrode is formed by forming the first film of Al containing Cu at or over the solid solubility limit of Cu to Al, subsequently forming at least one unit of the second film of Al containing Mg at or over the solid solubility limit of Mg to Al and the third film of Al containing Cu at or over the solid solubility limit of Cu to Al in this order, and then thermally treating the first, second and third films at 100 to 350° C. thereby diffusing Mg from the second film to the first and third films.

Here, the addition amount of Mg is preferably 6 wt % or less, particularly preferably 1 to 4 wt %, with respect to the whole electrode. If Mg is more than 6 wt %, the resistance of the electrode rises and the properties of the SAW device deteriorate. Also the power durability deteriorates with increase of Joule heat.

The thickness of the second film is preferably adjusted as appropriate so that the amount of Mg finally existing in the electrode falls within the above-mentioned range. For example, if the addition amount of Mg is large, the second film is required to be thin, while, if the addition amount of Mg added is small, the second film is required to be thick. Preferably, the addition amount of Mg and the thickness of the second film are set as appropriate in consideration of conditions such as the total thickness of the electrode and the like required of the SAW device.

On the other hand, the addition amount of Cu is preferably 3 wt % or less, particularly preferably 0.5 to 2 wt %, with respect to the whole electrode. This range is set for the same reason as described above with regard to Mg. It is noted that the addition amount of Cu is smaller than that of Mg because the solid solubility of Cu to Al is smaller than that of Mg.

The thickness of the first and/or third films is preferably adjusted as appropriate so that the amount of Cu finally existing in the electrode falls within the above-mentioned range. For example, if the addition amount of Cu is large, the first and/or third film is required to be thin, while, if the addition amount of Cu added is small, the first and/or third film is required to be thick. Preferably, the addition amount of Cu and the thickness of the first and third film are set as appropriate in consideration of conditions such as the total thickness of the electrode and the like required of the SAW device.

The addition amounts of Cu and Mg in the electrode can be quantified, for example, by ICP-AES (inductively coupled plasma—atomic emission spectrometry).

The first, second and third films can be formed by any known process that is not particularly limited such as DC magnetron sputtering. The formation of the films is preferable performed in vacuum. Further, the first, second and third films are preferably formed continuously in vacuum. Their formation in vacuum prevents formation of oxide films at interfaces between the films, which in turn prevents an increase in the resistance of the electrode and an obstacle to the diffusion of the Mg at the later thermal treatment step which would be caused by oxide films.

Next, the first, second and third films are thermally treated at 100 to 350° C., more preferably 150 to 300° C., to diffuse Mg from the second film to the third and first films and also separate Cu in the first and third films. Thus the electrode is completed. The thermal treatment may be carried out at any stage after the formation of all the films. It may be combined with some manufacture step until the SAW device is packaged (for example, a step of encapsulating the device), Alternatively, thermal history in the manufacture process may be substituted for the thermal treatment. However, the thermal treatment is preferably carried out before the electrode is patterned in a desired form. If the thermal treatment is carried out before the patterning of the electrode, the diffusion of Mg and the separation of Cu is already finished at the patterning and the etching rate of the electrode can be raised. As a result, after-corrosion can also be prevented.

The thermal treatment is preferably performed in an atmosphere of an inert gas or in vacuum, which is for preventing the oxidation of the surface of the films during the thermal treatment.

Further, the electrode is usually patterned into a desired form. For its patterning, any known method may be used without any particular limitation. For example, a resist pattern corresponding to the desired form may be formed, the electrode may be patterned by dry etching such as reactive ion etching using the resist pattern as a mask and then the resist pattern is removed by ashing.

The electrode is preferably covered with an insulating film such as a $SiO_2$ film, a SiN film or the like. The insulating film can provide an electrically preferable insulating characteristic and prevent chemical corrosion at cutting. The insulating film may be formed by a known process such as sputtering method, CVD method or the like.

In the case where the SAW device is used as a filter (referred to as a SAW filter hereinafter), the following construction may be adopted.

The SAW filter may be designed using a technique of constructing a SAW filter of a ladder type, transversal type, mode coupling type or the like. Among these filters, preferred is a ladder-type SAW filter, which has a larger number of electrode pairs, a lower current density per a electrode finger and a preferable power durability.

FIG. 1 shows a schematic plan view illustrating the construction of a SAW resonator with one terminal pair which is a fundamental component of a ladder-type SAW filter. As understood from this figure, the SAW resonator is typically composed of two reflectors (C, D) and a pair of interdigital transducers (A, B).

In the ladder-type SAW filter, the SAW resonator of FIG. 1 is connected to an adjacent SAW resonator in parallel and/or in series. A plurality of one-terminal-pair first SAW resonators having a certain resonance frequency are disposed in parallel arms and one-terminal-pair second SAW resonators having a resonance frequency substantially equal to anti-resonance frequency of the one-terminal-pair first SAW resonators are disposed in series arms. Here, it is preferable that the period λ of the interdigital transducers of the SAW resonators disposed in the parallel arms (hereafter referred to as parallel SAW resonators) is different from the period λ of the interdigital transducers of the SAW resonators disposed in the series arms (hereinafter referred to as series SAW resonators) so as to give different resonance freguencies.

More specifically, when a 42° Y cut-X propagation $LiTaO_3$ substrate is used in a 800 MHz band filter, the period λ of the parallel SAW resonators is preferably 4.68 to 4.92 μm and the period λ of the series SAW resonators is preferably 4.58 to 4.72 μm if the filter is to be used as a transmitting filter for AMPS (Advanced Mobil Phone System). On the other hand, if the filter is to be used as a receiving filter for AMPS, the period λ of the parallel SAW resonators is preferably 4.40 to 4.64 μm and the period λ of the series SAW resonators is preferably 4.2 to 4.44 μm. Here, the width X of the comb-form electrodes is typically a quarter of the period λ.

The aperture length Y of the SAW resonators is preferably 60 to 120 μm for the parallel SAW resonators and is preferably 40 to 80 μm for the series SAW resonators if the filter is to be used as an 800 MHz band filter.

The number of electrode pairs Z in the comb-form electrode is preferably 40 to 120 for the parallel SAW resonators and is preferably 60 to 130 for the series SAW resonators if the filter is to be used as an 800 MHz band filter.

The electrode construction of the SAW resonator shown in FIG. 1 is for illustration only and the construction of the SAW resonator of the present invention is not specifically limited to the one shown in FIG. 1 alone.

The above-described SAW device of the present invention can be applied to a filter, a resonator, a delay line, an oscillator, a matched filter, an acousto-optical device, a convolver and the like.

EXAMPLES

The present invention is now described in further detail by means of examples and comparative examples, which should not be construed to limit the scope of the invention.

First explained are specific designing conditions for a SAW device used in the examples. The SAW device was an antenna duplexer for AMPS. This duplexer was composed of a transmitting filter (band: 824 to 849 MHz) and a receiving filter (band: 869 to 894 MHz). In the examples, a power durability test was carried out on the transmitting filter to which higher power is applied. The transmitting filter is required to ensure a power durability to 1W which is the largest power applied in practical use. However, since it takes a lot of time and therefore impossible to actually determine the life of the transmitting filter under this power, the accelerating power durability test was performed at an applied power of 2W.

The electrode design complied with a specification of a generally called ladder type filter. This type of filter has a plurality of one-terminal-pair SAW resonators disposed in series arms and in parallel arms, respectively. The one-terminal-pair SAW resonators each had interdigital transducers and reflectors provided at both ends of the interdigital transducers. More specifically, series resonators (S1 to S4) and parallel resonators (P1 and P2) were arranged in order of S1-P1-S2-S3-P2-S4. The aperture length, electrode pair number and period of S1 were 50 μm, 95 pairs and 4.60 μm, respectively, the aperture length, electrode pair number and period of S2 to S4 were 100 μm, 95 pairs and 4.60 μm, respectively, and the aperture length, electrode pair number and period of P1 and P2 were 120 μm, 95 pairs and 4.80 μm, respectively. The width of the interdigital transducers was a quarter of the period.

Example 1

A 42° Y cut-X propagation LiTaO$_3$ piezoelectric single crystal substrate was used as a piezoelectric substrate, The following two types of metal laminate films were formed on this substrate by DC magnetron sputtering method to give six samples for each type.
(1) Three-layer film of an Al-1 wt % Cu film (100 nm), an Al-4 wt % Mg film (210 nm) and an Al-1 wt % Cu film (100 nm) formed in vacuum continuously in this order (see FIG. 2(a)).
(2) Seven-layer film of Al-1 wt % Cu film (50 nm), an Al-4 wt % Mg film (70 nm), an Al-1 wt % Cu film (50 nm), an Al-4 wt % Mg film (70 nm), an Al-1 wt % Cu film (50 nm), an Al-4 wt % Mg film (70 nm) and an Al-1 wt % Cu film (50 nm) formed in vacuum continuously in this order (see FIG. 2(b)).

Figure 2:
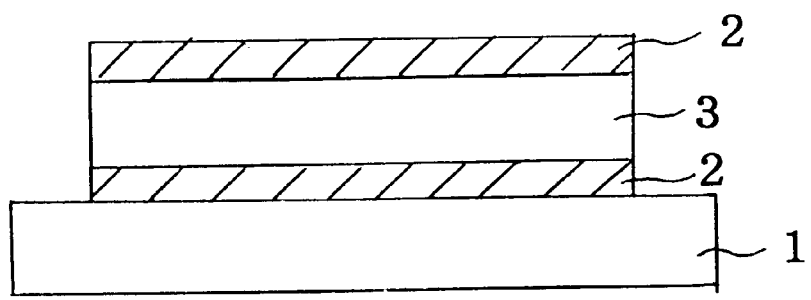
FIGS. 2(a) and (b) are a schematic sectional view of the electrodes of the SAW device in accordance with the present invention.
Figure 2:
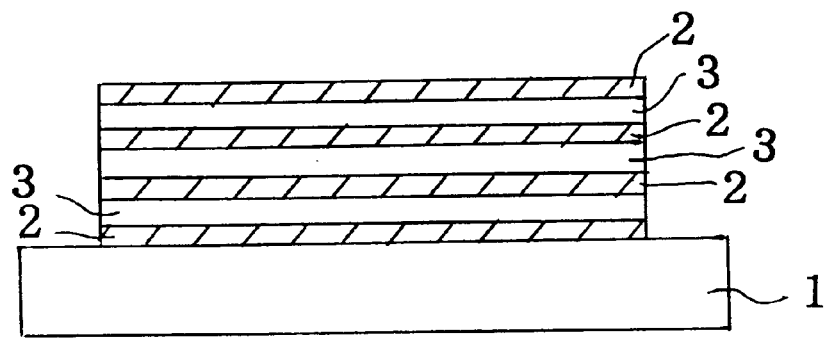

In FIGS. 2(a) and 2(b), reference numeral 1 denotes a substrate, 2 an Al-1 wt % Cu film and 3 an Al-4 wt % Mg film.

Subsequently, five samples of the three-layer film and the seven-layer film were thermally treated at 150° C., 200° C., 250° C., 300° C. and 350° C. (in vacuum of $10^{-1}$ Torr for an hour).

Thereafter, the samples were patterned for forming interdigital transducers by reactive ion etching and protective films of SiN of 50 nm thickness were formed on the electrodes by RF magnetron sputtering method. Thus the above described transmitting filters were formed.

Figure 3:
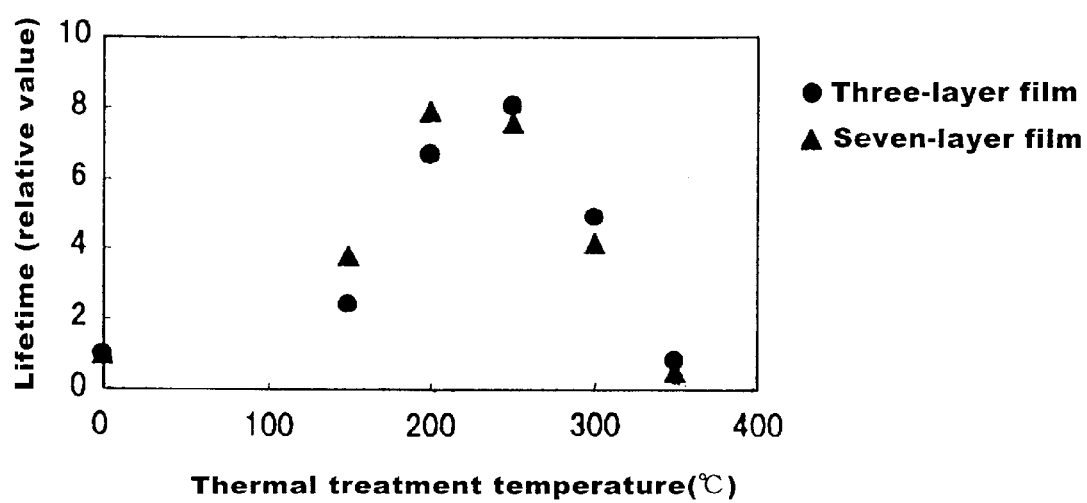
FIG. 3 is a graph showing changes in the lifetime of a SAW device of Example 1 with respect to a thermal treatment temperature.

The obtained transmitting filters were evaluated on their power durability. Evaluation was performed by determining their life. Here the life means a time period until the filter characteristics deteriorate (more specifically, the bandwidth decrease by 2 MHz or more from an initial value). As for evaluation conditions, the environmental temperature was 85° C., the frequency applied was 849 MHz, which is the weakest in a filter band, and the power applied was 2W. FIG. 3 shows changes in the life with respect to the thermal treatment temperature. In this figure, the life plotted in ordinate means the life of a thermally treated sample divided by the life of a sample which was not thermally treated.

It was confirmed from the figure that the thermal treatment extended the life. It was further confirmed that the thermal treatment at 200 to 250° C. extended the life about eight times at the longest. It is because, by the thermal treatment, Mg which separated in the Al-4 wt % Mg film diffused at the grain boundary of the Al-1 wt % Cu films and formed an alloy composed of Al, Cu and Mg. The diffusion of Mg was confirmed by determining a concentration distribution of Mg in a direction of the thickness of the electrodes by SIMS (secondary ion mass spectrometry) method.

Figure 4:
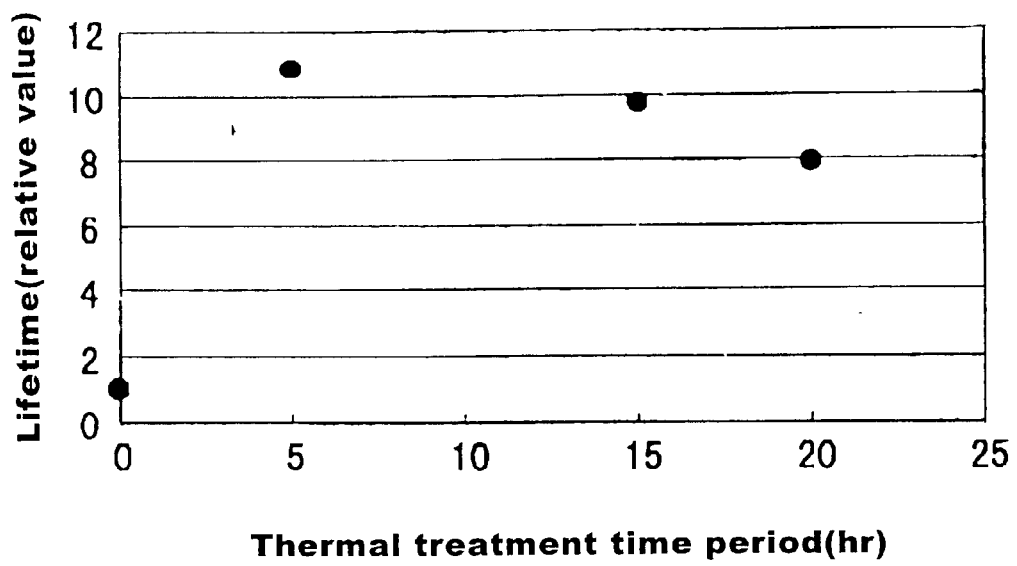
FIG. 4 is a graph showing changes in the lifetime of a SAW device of Example 1 with respect to thermal treatment time periods.

Subsequently, besides the above obtained samples, four samples of the three-layer film were made. The four samples were thermally treated at a fixed temperature (180° C.) and pressure (in vacuum of $10^{-1}$ Torr) for 0, 5, 15 and 20 hours, and the life of transmitting filters was determined. The results are shown in FIG. 4. The life plotted in ordinate of FIG. 4 has the same meaning in FIG. 3. It was found that the life was extended about 11 times by the thermal treatment for about 5 hours.

The optimal conditions and time are set as appropriate according to various conditions since they are affected by various conditions such as the electrode construction and others.

Example 2

Produced were two samples of each of the following five kinds of metal films in the same manner as in Example 1 except for the composition of the metal films.
(1) A single layer of an Al-3 wt % Mg film (420 nm),
(2) A single layer of an Al-2.3 wt % Mg-0.5 wt % Cu film (420 nm),
(3) Two-layer film of an Al-3 wt % Mg film (320 nm) and an Al-2 wt % Cu film (100 nm),
(4) Three-layer film of an Al-2 wt % Cu film (50 nm), an Al-3 wt % Mg film (320 nm) and an Al-2 wt % cu film (50 nm),
(5) Five-layer film of an Al-2 wt % Cu film (30 nm), an Al-3 wt % Mg film (160 nm), an Al-2 wt % Cu film (30 nm), an Al-3 wt % Mg film (160 nm) and an Al-2 wt % Cu film (35 nm).

Among the above-mentioned samples, one of the two samples was thermally treated at 200 in a $N_2$ gas atmosphere for two hours. The other one was not thermally treated. Next, the samples were formed into interdigital transducers by reactive ion etching, and protective films of $SiO_2$ of 30 nm were formed by plasma CVD method. Thus the above-described transmitting filters were formed.

The obtained transmitting filters were evaluated on their power durability in the same manner as in Example 1. The results are shown in Table 1.

TABLE 1

| Samples | Life (time) | |
| --- | --- | --- |
| | Not thermally treated | Thermally treated |
| (1) Single layer | 18 | 13 |
| (2) Single layer | 3 | 7 |
| (3) Two-layer film | 19 | 37 |
| (4) Three-layer film | 23 | 278 |
| (5) Five-layer film | 25 | 247 |

As clearly understood from Table 1, it was confirmed that the transmitting filters having the thermally treated three-layer films or five-layer films exhibited greatly extended life.

According to the SAW device and its manufacture process of the present invention, the power durability can be remarkably improved as compared with the conventional SAW device. Thereby, the application of the SAW device to an antenna duplexer can be developed, and its reliability when applied to a quasi-microwave band can also be improved.

What is claimed is:

1. A surface acoustic wave device comprising:

a substrate at least a surface of which has a piezoelectric function, and an electrode formed on the substrate, wherein the electrode is composed of a first film of Al containing Cu at or over a solid solubility limit of Cu to Al and one or more unit(s) of a second film of Al containing Mg at or over a solid solubility limit of Mg to Al and a third film of Al containing Cu at or over the solid solubility limit of Cu to Al formed on the second film in this order, and the first film and the third film contain Mg diffused from the second film.

2. The surface acoustic wave device according to claim 1, wherein the electrode formed of the first film, the second film(s) and the third film(s) contains 6 wt % or less Mg.

3. The surface acoustic wave device according to claim 1, wherein the electrode formed of the first film, the second film(s) and the third film(s) contains 3 wt % or less Cu.

4. The surface acoustic wave device according to claim 1, wherein the electrode is covered with an insulating film.

5. The surface acoustic wave device according to claim 4, wherein the insulating film is formed of a $SiO_2$ film or a SiN film.

* * * * *